United States Patent [19]

Hanawa et al.

[11] Patent Number: 5,238,730
[45] Date of Patent: Aug. 24, 1993

[54] ELECTRICAL LAMINATE WITH DIBASIC ACID-MODIFIED EPOXY (METH)ACRYLATE

[75] Inventors: Akinori Hanawa, Shimotsuma; Mitsuo Yokota, Yuki; Akira Shimizu, Shimodate; Kazuyuki Tanaka; Yukihiko Yamashita, both of Hitachi, all of Japan

[73] Assignee: Hitachi Chemical Company, Ltd., Tokyo, Japan

[21] Appl. No.: 717,498

[22] Filed: Jun. 19, 1991

Related U.S. Application Data

[63] Continuation of Ser. No. 331,757, Apr. 3, 1989, abandoned.

[30] Foreign Application Priority Data

Apr. 4, 1988 [JP] Japan ................ 63 82574

[51] Int. Cl.$^5$ .................. B32B 17/04; B32B 23/02
[52] U.S. Cl. ........................ 428/249; 428/251; 428/253; 428/264; 428/268; 428/273; 428/274; 525/65; 525/438
[58] Field of Search ............ 525/111.5, 112, 65, 525/438; 428/251, 273, 415, 249, 253, 264, 268, 274

[56] References Cited

U.S. PATENT DOCUMENTS

| | | |
|---|---|---|
| 3,524,901 | 8/1970 | Najvar . |
| 4,654,233 | 3/1987 | Grant et al. .......... 525/111 |
| 5,068,257 | 11/1991 | Noguchi ................ 525/65 |

FOREIGN PATENT DOCUMENTS

| | | | |
|---|---|---|---|
| 00054-86 | 5/1979 | Japan . | |
| 55-74876 | 6/1980 | Japan . | |
| 60-28418 | 2/1985 | Japan .................. | 525/65 |
| 60-84350 | 5/1985 | Japan . | |

OTHER PUBLICATIONS

Patent Abstracts of Japan, vol. 9, No. 222.
Database WPIL, accession No. 84-130947.

Primary Examiner—Robert E. Sellers
Attorney, Agent, or Firm—Antonelli, Terry, Stout & Kraus

[57] ABSTRACT

A thermosetting resin composition comprising (A) a dibasic acid modified epoxy (meth)acrylate resin obtained by reacting a bromine-containing epoxy resin with a dibasic acid of 4 or more carbon atoms followed by further reacting with acrylic acid or methacrylic acid, (B) a thermosetting resin having an unsaturated group, the unsaturated group being copolymerizable with the resin (A), and (C) a polymerizable monomer; and an electrical laminate produced by using the thermosetting resin composition are disclosed.

9 Claims, No Drawings

ELECTRICAL LAMINATE WITH DIBASIC ACID-MODIFIED EPOXY (METH)ACRYLATE

This is a continuation of application Ser. No. 331,757, filed Apr. 3, 1989.

BACKGROUND OF THE INVENTION (a) Field of the Invention

The present invention relates to a thermosetting resin composition which may be suitably used for the production of electrical laminates (insulating laminate, copper clad laminate for printed circuit board, etc.) having excellent flame resistance, electrical properties, and punching quality, and to an electrical laminate produced by using the thermosetting resin composition.

(b) Description of the Related Art

The recent progress of semiconductor technology and advancement of electronic apparatus have been increasing the demand for printed boards and, at the same time, the higher quality of printed circuits has been required. At the present time, in the production of electrical laminates, combination of a glass base material with an epoxy resin, combination of a paper base material with a phenolic resin or an unsaturated polyester resin, or the like are generally employed.

Particularly, in the production of paper base material-phenolic resin- or paper base material-unsaturated polyester resin-laminates and -printed circuit boards, which are used mainly for consumer appliances, improvement of flame resistance has been contrived for safety's sake and, in concurrence, improvement of size accuracy and decrease of punching temperature are also contrived for facilitating automatic mounting of parts by insertion.

The conventional flameploofing by introduction of halogen atoms in the resin skeleton and addition of various kinds of flame retardants has a disadvantage in that sufficient flame resistance cannot be attained without the decrease of the other necessary properties such as heat resistance, chemical resistance, electrical properties, etc.

Also, the conventional methods of improving punching quality by adding plasticizers or by endowing the resin skeleton with flexibility cause the decreases of heat resistance, chemical resistance, moisture resistance, etc.

In Japanese Patent Application Publication No. 60-17340 disclosed is a method wherein a resin obtained by reacting a halogenized bisphenol A diglycidyl ether with a dimer acid is used as the flame retardant for thermosetting resins, and in Japanese Patent Application Publication open No. 60-45061 disclosed is a method of using a resin varnish consisting of a dicyclopentadiene polyester resin, an acrylic ester of diglycidyl ether or glycidyl ester through a dibasic acid of 4 to 36 carbon atoms, and an organic peroxide. However, these conventional methods failed in providing laminates satisfying all requirements concurrently, that is, good flame resistance, improvement of the punching quality at low temperature, moisture resistance, chemical resistance, and excellent electrical properties.

SUMMARY OF THE INVENTION

An object of the present invention is to provide a thermosetting resin composition which may be suitably used for producing laminates having good flame resistance and excellent punching quality at low temperature and having concurrently satisfactory heat resistance, moisture resistance, chemical resistance, and electrical properties.

Another object of the present invention is to provide an electrical laminate having the excellent properties described above.

According to the present invention, there is provided a thermosetting resin composition comprising (A) a dibasic acid modified epoxy (meth)acrylate resin obtained by reacting a bromine-containing epoxy resin with a dibasic acid of 4 or more carbon atoms followed by further reacting with acrylic acid or methacrylic acid, (B) a thermosetting resin having an unsaturated group, the unsaturated group being copolymerizable with the resin (A), and (C) a polymerizable monomer.

An electrical laminate excelling in flame resistance, heat resistance, moisture resistance, chemical resistance, electrical properties, and low temperature punching quality can be produced by impregnating a base material with the thermosetting resin composition of the present invention followed by curing.

DESCRIPTION OF THE PREFERRED EMBODIMENT

In the present invention, the term of bromine-containing epoxy resin means an epoxy compound having at least two epoxy groups in one molecule and containing bromine in the resin. Particularly preferred bromine-containing epoxy resin to be used in the present invention has a bromine content of not less than 35% by weight. The bromine-containing epoxy resin may be either one consisting only of a brominated epoxy resin having bromine in its molecule skeleton or a mixture of a brominated epoxy resin and a non-brominated epoxy resin. The preferred brominated epoxy resin to be used in the present invention has a bromine content of 15 to 55% by weight. Some illustrative examples of such a brominated epoxy resin include epoxy resins obtained by polycondensing a bromine-containing polyhydric phenol, such as tetrabromobisphenol A, tetrabromobisphenol F, and a brominated novolak resin, with epichlorohydrin. Among these, the preferred are those of tetrabromobisphenol A type having a bromine content of 15 to 55% by weight. Examples of commercially available brominated epoxy resins which may be used in the present invention include SUMI-EPOXY ESB-340, ESB-400, ESB-500, and ESB-700 produced by Sumitomo Chemical Co., Ltd., DER-542, DER-511, and DER-580 produced by Dow Chemical Co., Ltd., and EPIKOTE 1045, 1046, 1050, and DX248 produced by Yuka Shell Kabushiki Kaisha. These brominated epoxy resins may be mixed with non-brominated epoxy resins to adjust the bromine content to a predetermined amount. In such a case, the resulting bromine-containing epoxy resin contains preferably not less than 25% by weight of brominated epoxy resin.

Various kinds of dibasic acids, such as maleic acid, phthalic acid, adipic acids, and dimer acid, may be used in the present invention as the dibasic acid of 4 or more carbon atoms. From the viewpoint of the ability of endowing flexibility, it is preferable to use polymeric fatty acids, which may be obtained by polymerizing an unsaturated fatty acid, preferably an unsaturated fatty acid of 16 to 18 carbon atoms. The particularly preferred is dimer acid. Preferred examples of commercially available dibasic acids which may be used in the present invention include ENPOL 1022 and ENPOL 1024 produced by Emery Co., Ltd. and VERSADYME 216, 228, and 288 produced by Henkel Hakusui Kabushiki Kaisha, which have a dimer acid content of 30 to 97%, preferably 50 to 97%, and an acid value of 180 to 200. The ratio of the amount of the dibasic acid used to the amount of the epoxy resin used is not particularly restricted, but it is preferable to react 0.01 to 0.9 equivalent, more preferably 0.1 to 0.9 equivalent of dibasic acid with one equivalent of epoxy resin.

Various kinds of methods may be employed for the reaction of the bromine-containing epoxy resin with the dibasic acid of 4 or more carbon atoms, and, generally, the bromine-containing epoxy resin and the dibasic acid are reacted at 70° to 150° C., in the presence of an organic amine catalyst, such as triethylamine, benzyldimethylamine, tri-n-butylamine, N,N-dimethylaniline, and N,N-dimethylcyclohexylamine, or an alkaline metal hydroxide catalyst, such as sodium hydroxide and lithium hydroxide. In this reaction, at need, a solvent, such as toluene, ethyl acetate, and methyl ethyl ketone, or a polymerizable monomer, such as styrene, may be added individually or in a combination of two or more of them. When a polymerizable monomer such as styrene is added, it is preferable to further add an stabilizer such as hydroquinone, cathechol, picric acid, and molecular oxygen.

After progressing the reaction in some degree, acrylic acid or methacrylic acid is further reacted in an amount necessary for reacting with the residual epoxy groups from the above reaction. In this reaction, a part of the epoxy groups may remain not reacted. The amount of the acrylic acid or methacrylic acid used is 0.1 to 0.9 equivalent per 1 equivalent of brominated epoxy resin used, and the preferred total amount of the dibasic acid and acrylic acid or methacrylic acid is one equivalent or less. When it is necessary to accelerate the reaction, the catalysts described above may be added in an appropriate amount.

Thus obtained dibasic acid modified epoxy (meth)acrylate resin (A) has preferably a bromine content of 12 to 50% by weight.

The thermosetting resins (B) having an unsaturated group copolymerizable with the resin (A), which are to be used in the present invention, are not particularly restricted, and are divided broadly into two categories, those having the unsaturated groups in their main chains and those having the unsaturated groups in their side chains.

The preferred thermosetting resins (B) having the unsaturated groups in main chain are thermosetting polyester resins.

Some examples of the thermosetting resins (B) having the unsaturated groups in side chains include those which are obtained by polymerizing one or more of acrylic acid, acrylic esters, methacrylic acid and methacrylic esters and, at need, a polymerizable monomer containing vinyl group followed by reacting the obtained polymer's main chain with an unsaturated basic acid or an ester of the unsaturated basic acid to introduce unsaturated groups in a form of a pendant. Due to the absence of ester bond in main chain, these resins are superior to unsaturated polyester resins in corrosion resistance and dielectric property. Among these, the preferred are those having a main chain of an acrylic copolymer, particularly those obtained by the reaction of maleic anhydride to styrene/2-hydroxyethyl methacrylate/n-butyl acrylate copolymer or by the addition reaction of acrylic acid or methacrylic acid to ethyl acrylate/butyl acrylate/glycidyl methacrylate copolymer.

The preferred polymerizable monomer (C) to be used in the present invention has an unsaturated group and is in a liquid state at room temperature. Some illustrative examples of the preferred polymerizable monomer (C) include styrene, vinyltoluene, divinylbenzene, α-methylstyrene, methacrylic acid, methacrylic esters, acrylic esters, and mixtures thereof. The particularly preferred is styrene.

The ratios of the amount of the (B) thermosetting resin having an unsaturated bond copolymerizable with (A) used and the amount of the (C) polymerizable monomer used to the amount of the (A) dibasic acid modified epoxy (meth)acrylate resin used may be determined appropriately depending on the halogen content and viscosity of the resin composition and are not particularly restricted. However, it is preferable to use 5 to 400 parts of (B) and 25 to 400 parts by weight of (C) per 100 parts by weight of (A), while maintaining the bromine content of the resin composition preferably to 8 to 30% by weight.

Also, the other flame retardants may be added to these resins for impregnating base materials, at need. Typical examples of such flame retardants include halogen-containing flame retardants such as hexabromocyclododecane, hexabromobenzene, polybrominated biphenyl ether, heptabromotoluene, 2,4,6-tribromophenol methacrylate, 2,4,6-tribromophenol glycidyl ether, brominated epoxy resins; and phosphoric esters such as triphenyl phosphate, tricresyl phosphate, and trimethyl phosphate. The particularly preferred flame retardants are those which can be polymerized with the thermosetting resin compositions of the present invention.

Further, antimony trioxide, antimony pentoxide, aluminum hydroxide, and the like may also be used as flame retardant. In addition to flame retardant, extenders such as clay, talc, and wollastonite may be added optionally.

The base materials which is to be impregnated with the thermosetting resin composition of the present invention include cellulosic base materials such as kraft paper and linter paper, glass base materials such as glass cloth, glass nonwoven fabric, and glass mixed paper.

When cellulosic papers are used, it is preferable to treat the cellulose papers with melamine resin or the like previous to impregnation of the resin composition.

When glass base materials are used, it is preferable to treat the glass base materials with a coupling agent such as vinyl silane previously.

Curing of the resin composition may be conducted either by a method of curing by adding an organic peroxide to the resin at room temperature or at an increased temperature, or by a method of irradiating light or electron ray with using a sensitizer or the like.

The electrical laminate obtained by impregnating a base material with the thermosetting resin composition described above has excellent heat resistance and flexibility endowed by modifying an brominated epoxy (meth)acrylate resin with a dibasic acid of 4 or more carbon atoms and has excellent heat resistance. Further, when a thermosetting resin having unsaturated bonds in its side chains is used to prevent the introduction of ester bond in its main chain, the produced laminate is superior to those produced by using conventional unsaturated polyester resin or the like in electrical properties, particularly in insulating resistance and dielectric property.

The present invention is described in more details referring to the following Examples. In the following description, the term "part" means "part by weight".

EXAMPLES 1 TO 5 AND COMPARATIVE EXAMPLES 1 AND 2

REFERENTIAL EXAMPLE 1

In a flask were charged 231 parts of ESB-400 (trade name, bisphenol type brominated epoxy resin produced by Sumitomo Chemical Co., Ltd.), 83 parts of dimer acid, 3.3 parts of triethylamine, 144 parts of styrene, and 0.02 parts of hydroquinone, and the mixture was reacted at 90° to 100° C. until the acid value dropped to not higher than 6. Subsequently, 20 parts of methacrylic acid was added to the reaction mixture, and the reaction was allowed to continue until the acid value dropped to not more than 4 to obtain a dimer acid modified brominated epoxy methacrylate resin (resin (1)). (non-volatile matter: 70%, bromine content: 23%)

REFERENTIAL EXAMPLE 2

The procedure of the Referential Example 1 was repeated with the exception that acrylic acid was used in place of methacrylic acid, to obtain a resin (resin (2)).

REFERENTIAL EXAMPLE 3

The procedure of the Referential Example 1 was repeated with the exception that dimer acid was not added, and the brominated epoxy resin and the same epoxy resin not brominated were used, and an epoxy methacrylate resin (resin (3)) was obtained. (non-volatile matter: 70%, bromine content: 23%)

REFERENTIAL EXAMPLE 4

Solution polymerization was carried out using, as the raw materials, 10 parts of ethyl acrylate, 70 parts of butyl acrylate, and 20 parts of glycidyl methacrylate and, as the solvent, methyl isobutyl ketone, and the solvent was then removed off from the reaction product to obtain a solventless copolymer. Subsequently, after 10 parts of acrylic acid was addition-reacted to the copolymer to add side chains having double bonds, styrene was added to obtain a thermosetting resin containing 60% of non-volatile matter (resin (4)).

REFERENTIAL EXAMPLE 5

Solution polymerization was carried out using, as the raw materials, 30 parts of styrene, 40 parts of 2-hydroxyethyl methacrylate, and 40 parts of n-butyl acrylate and, as the solvent, methyl isobutyl ketone. Subsequently, after maleic anhydride was addition-reacted to the obtained copolymer to add side chains having double bonds, styrene was added to obtain a thermosetting resin containing 60% of non-volatile matter (resin (5)).

EXAMPLE 1

A kraft paper, which had been treated previously with an aqueous solution of methylol melamine (MELAN 630, produced by Hitachi Chemical Company, Ltd.), having a resin content of 14%, a thickness of 0.25 mm, and a basic weight of 140 g was impregnated with a liquid resin blend composed of 60 parts of resin (1), 40 parts of resin (5), 5 parts of antimony trioxide, and one part of benzyl peroxide, to obtain an impregnated kraft paper having a total resin content of 70%. After laminating six resin impregnated kraft papers followed by further laminating an electrolytic copper foil of 35 μm thickness coated with an epoxy adhesive, the obtained laminate was cured by heating and pressing at 120° C., under a pressure of 15 kg/cm², for 20 minutes, to obtain a copper clad laminate of 1.6 mm thickness.

EXAMPLE 2

The procedure of the Example 1 was repeated with the exception that 60 parts of resin (2) and 40 parts of resin (4) were used in place of resin (1) and resin (5), and a copper clad laminate of 1.6 mm thickness was obtained.

COMPARATIVE EXAMPLE 1

The procedure of the Example 1 was repeated with the exception that resin (3) and resin (5) were used in place of resin (1) and resin (5), and a copper clad laminate of 1.6 mm thickness was obtained.

REFERENTIAL EXAMPLE 6

The procedure of the Referential Example 2 was repeated with the exception that a mixture of 189 parts of a brominated epoxy resin, SUMI-EPOXY ESB-400 (trade name, a tetrabromobisphenol A type epoxy resin), and 42 parts of a non-brominated epoxy resin (trade name: EPOMIC R-140P produced by Mitsui Petrochemical Industries, Ltd.) was used as the bromine-containing epoxy resin, and a dimer acid modified epoxy methacrylate resin (resin (6)) was obtained. (non-volatile matter: 70% by weight, bromine content: 19% by weight)

EXAMPLE 3

The procedure of the Example 1 was repeated with the exception that 74 parts of resin (6) and 26 parts of resin (5) were used in place of resin (1) and resin (5), and a copper clad laminate of 1.6 mm thickness was obtained.

REFERENTIAL EXAMPLE 7

A mixture of 100 parts of tetrabromobisphenol A glycidyl ether (epoxy equivalent: 395 to 410), 35.7 parts of dimer acid, 1.3 parts of benzyldimethylamine, 62 parts of styrene, and 0.05 parts of hydroquinone was reacted at 90° to 100° C. until the acid value dropped not more than 6, and reaction was then continued by adding 9 parts of methacrylic acid, to obtain a dimer acid modified epoxy methacrylate resin having an acid value of 2.3 (resin (7)).

REFERENTIAL EXAMPLE 8

The procedure of the Referential Example 7 was repeated with the exception that 9 parts of acrylic acid was used in place of 9 parts of methacrylic acid, and a resin having an acid value of 3.0 (resin (8)).

REFERENTIAL EXAMPLE 9

A mixture of 891 parts of diethylene glycol, 374 parts of maleic anhydride, 634 parts of isophthalic acid, and 0.2 parts of hydroquinone was heated to 210° C. while blowing nitrogen gas in, and heating was then continued at the same temperature until the acid value reach 21.0 to obtain an unsaturated polyester resin (resin 9)).

EXAMPLE 4

A resin solution was prepared by mixing 50 parts of the above described resin (7) 50 parts of resin (9), 15 parts of styrene, 10 parts of triphenyl phosphate, and 1 part of benzyl peroxide. A kraft paper of 0.25 mm thickness was pretreated with resin solution of methylol melamine (MELAN 630 produced by Hitachi Chemical Company, Ltd) to obtain a base material having a resin content of 14% by weight. The pretreated base material was impregnated with the resin solution previously obtained to obtain a resin impregnated base material having a total resin content of 70% by weight. After laminating six resin impregnated base materials followed by further laminating an electrolytic copper foil of 35 μm thickness coated with an epoxy adhesive, the obtained laminate was cured by heating and pressing at 120° C., under a pressure of 15 kg/cm$^2$, for 20 minutes, to obtain a copper clad laminate of 1.6 mm thickness.

EXAMPLE 5

The procedure of the Example 4 was repeated with the exception that the resin (7) was replaced by resin (8) and 4 parts of antimony trioxide was added in place of triphenyl phosphate, to obtain a copper clad laminate having a thickness of 1.6 mm.

COMPARATIVE EXAMPLE 2

The procedure of the Example 4 was repeated with the exception that 1 part of benzoyl peroxide and 30 parts of styrene were added to 100 parts of the resin (9), to obtain a copper clad laminate having a thickness of 1.6 mm.

The results of various tests conducted on the copper clad laminates obtained in the above Examples are shown in the Table 1.

acrylic copolymer, the unsaturated groups being copolymerizable with the resin (A), the thermosetting resin (B) being obtained by reaction of maleic anhydride to a styrene/2-hydroxyethyl methacrylate/butyl acrylate terpolymer, and (C) a polymerizable monomer selected from the group consisting of styrene, vinyltoluene, divinylbenzene, methacrylic acid, a methacrylic ester, an acrylic ester and a mixture thereof.

2. The electrical laminate as claimed in claim 1, wherein the bromine-containing epoxy resin is a mixture of (a) a brominated epoxy resin and (b) a non-brominated epoxy resin, the mixture containing at least 25% by weight of the brominated epoxy resin (a).

3. The electrical laminate as claimed in claim 2, wherein the brominated epoxy resin (a) is a bisphenol A epoxy resin.

4. The electrical laminate as claimed in claim 3, wherein the bromine content of the brominated epoxy resin (a) is 15 to 55% by weight.

5. The electrical laminate as claimed in claim 1, wherein 0.1 to 0.9 equivalent of the dibasic acid and 0.1 to 0.9 equivalent of acrylic acid or methacrylic acid are used per one equivalent of the bromine-containing epoxy resin, the total equivalent of the dibasic acid and acrylic acid or methacrylic acid being one equivalent or less.

6. The electrical laminate as claimed in claim 1, wherein the bromine content of the resin (A) is 12 to 50% by weight.

7. The electrical laminate as claimed in claim 1, wherein the polymerizable monomer (C) exhibits a liquid state at room temperature.

8. The electrical laminate as claimed in claim 7, wherein the polymerizable monomer (C) is styrene.

9. The electrical laminate as claimed in claim 1, wherein the thermosetting resin composition comprises 100 parts by weight of the resin (A), 5 to 400 parts by weight of the thermosetting resin (B), and 25 to 400 parts by weight of the polymerizable monomer (C), and the bromine content of the thermosetting resin composition is 8 to 30% by weight.

TABLE 1

| | Example 1 | Example 2 | Example 3 | Example 4 | Example 5 | Comparative Example 1 | Comparative Example 2 |
|---|---|---|---|---|---|---|---|
| Water absorption (%) E-24/50 + D-24/23 | 0.45 | 0.46 | 0.48 | 0.45 | 0.41 | 0.41 | 0.49 |
| Insulation resistance (Ω) (D-2/100) | $1.2 \times 10^{10}$ | $1.1 \times 10^{10}$ | $5.0 \times 10^9$ | $5.5 \times 10^8$ | $6.1 \times 10^8$ | $2.0 \times 10^{11}$ | $3.2 \times 10^8$ |
| Soldering heat resistance 260° C. (second) | 60 | 57 | 62 | 50 | 57 | 90 | 40 |
| Flame resistance | V-0 | V-0 | V-0 | V-1 | V-1 | V-0 | HB |
| Dielectric constant A (1 MHz) D-48/50 | 3.9 / 4.6 | 3.8 / 4.6 | 3.9 / 4.5 | 4.2 / 4.8 | 4.0 / 4.6 | 3.7 / 4.3 | 4.4 / 5.0 |
| Dielectric dissipation A factor (1 MHz) D-48/50 | 0.0240 / 0.0280 | 0.0242 / 0.0288 | 0.241 / 0.283 | 0.0310 / 0.0450 | 0.0300 / 0.0420 | 0.0260 / 0.0289 | 0.0340 / 0.0450 |
| Punching quality | | | | | | | |
| 20° C. | △ | △ | △ | ○~△ | △ | X | △~X |
| 40° C. | ○ | ○ | ○~△ | ○ | ○ | △~X | ◎~△ |
| 60° C. | ○ | ○ | ○ | ○ | ○ | △ | ◎ |
| 80° C. | ○ | ○ | ○ | ○~△ | ○~△ | ○~△ | ◎ |

Test methods
Flame resistance: UL268 & 492
Punching quality: ASTM D617-44
the others: JIS C 6481
D; dipping    E; drying    A; normal condition    24/50; measurement after standing at 50° C. for 24 hours

What is claimed is:

1. An electrical laminate produced by impregnating a base material with a thermosetting resin composition comprising (A) a dibasic acid modified epoxy (meth)acrylate resin obtained by reacting a bromine-containing epoxy resin with a dibasic acid followed by further reacting with acrylic acid or methacrylic acid, the dibasic acid being a polymeric fatty acid obtained by polymerizing an unsaturated fatty acid of 16-18 carbon atoms, (B) a thermosetting resin having a plurality of unsaturated groups in side chains and a main chain of an

* * * * *